(12) United States Patent
Lee et al.

(10) Patent No.: US 8,617,796 B2
(45) Date of Patent: Dec. 31, 2013

(54) PHOTOSENSITIVE RESIN COMPOSITION FOR COLOR FILTER AND COLOR FILTER USING THE SAME

(75) Inventors: In-Jae Lee, Uiwang-si (KR); Ji-Yun Kwon, Uiwang-si (KR); Ju-Ho Jung, Uiwang-si (KR); Dong-Won Song, Uiwang-si (KR); Han-Chul Hwang, Uiwang-si (KR); Jae-Hyun Kim, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 166 days.

(21) Appl. No.: 13/177,832

(22) Filed: Jul. 7, 2011

(65) Prior Publication Data
US 2012/0138858 A1    Jun. 7, 2012

(30) Foreign Application Priority Data
Dec. 1, 2010  (KR) .................. 10-2010-0121439

(51) Int. Cl.
*G03F 7/00*    (2006.01)
*C08K 5/42*    (2006.01)

(52) U.S. Cl.
USPC ........... 430/281.1; 430/270.1; 430/7; 522/74; 522/18; 522/184

(58) Field of Classification Search
USPC ............ 522/74, 18, 184; 430/7, 270.1, 281.1
See application file for complete search history.

(56) References Cited

U.S. PATENT DOCUMENTS

| | | | |
|---|---|---|---|
| 5,811,209 A | 9/1998 | Eida et al. | |
| 6,733,935 B2 * | 5/2004 | Kishimoto et al. | 430/7 |
| 7,601,764 B2 * | 10/2009 | Wu et al. | 522/37 |
| 7,749,664 B2 | 7/2010 | Suzuki et al. | |
| 2004/0191679 A1 | 9/2004 | Shibuya | |
| 2007/0287086 A1 | 12/2007 | Shinada et al. | |
| 2009/0202948 A1 | 8/2009 | Simpson et al. | |

FOREIGN PATENT DOCUMENTS

| | | |
|---|---|---|
| CN | 1656127 | 8/2005 |
| CN | 1896873 | 1/2007 |
| CN | 101517493 | 8/2009 |
| EP | 0725315 A2 | 8/1996 |
| JP | 08-179120 | 7/1996 |
| JP | 08211219 A * | 8/1996 |
| JP | 2009-299076 | 12/2009 |
| KR | 10-1996-0011513 | 4/1996 |
| KR | 10-1996-0029904 | 8/1996 |
| KR | 10-2001-0014409 A | 2/2001 |
| KR | 10-2001-0024701 A | 3/2001 |
| KR | 10-2007-0114005 A | 11/2007 |
| TW | 201037458 | 10/2010 |

OTHER PUBLICATIONS

JP 08211219 A, Aug. 1996, Machine translation.*
Chinese Search Report in counterpart Chinese Application No. 2011102380054 dated Nov. 22, 2012, pp. 1-2.
English translation of Chinese Search Report in counterpart Chinese Application No. 201110238005.4 dated Aug. 19, 2013, pp. 1-2.
Taiwanese Search Report in counterpart Taiwanese Application No. 100125290 dated Aug. 28, 2013, pp. 1-2.

* cited by examiner

*Primary Examiner* — Satya Sastri
(74) *Attorney, Agent, or Firm* — Additon, Higgins, Pendleton & Ashe, P.A.

(57) ABSTRACT

Disclosed is a photosensitive resin composition for a color filter that includes (A) an organic salt-type sulfonate-containing dye; (B) a pigment; (C) an acrylic-based binder resin; (D) a photopolymerizable monomer; (E) a photopolymerization initiator; and (F) a solvent.

8 Claims, No Drawings

PHOTOSENSITIVE RESIN COMPOSITION FOR COLOR FILTER AND COLOR FILTER USING THE SAME

CROSS-REFERENCE TO RELATED APPLICATION

This application claims priority under 35 USC Section 119 to and the benefit of Korean Patent Application No. 10-2010-0121439 filed in the Korean Intellectual Property Office on Dec. 1, 2010, the entire disclosure of which is incorporated herein by reference.

FIELD OF THE INVENTION

The present invention relates to a photosensitive resin composition for a color filter and a color filter using the same.

BACKGROUND OF THE INVENTION

Color filters are used as optical filters for various electronic products, such as liquid crystal displays (LCDs), cameras, and the like. Color filters are thin film-type optical parts extracting more than 3 colors from a white light and forming fine pixel units. The pixel has a size of tens to hundreds of micrometers. Color filters can have a laminate structure including a black matrix layer with a predetermined pattern to block a boundary between pixels and a pixel region including a plurality of colors (in general, three primary colors of red (G), green (G), and blue (B)) sequentially arranged in a predetermined order on a transparent substrate. In general, methods for fabricating the colored thin film of a color filter include dyeing, printing, electrophoretic deposition (EPD), and pigment dispersion, among others. Currently, such methods are used to manufacture LCDs for mobile phones, laptops, monitors, TVs, and the like.

The dyeing method forms a colored film by forming an image on a glass substrate with a dyeing agent and then dyeing the image with a direct dye. Examples of the dyeing agent used in fabricating colored thin films include a natural photosensitive resin such as gelatin and the like, an amine-modified polyvinyl alcohol, an amine-modified acryl-based resin, and the like. However, the dyeing process may be complex and long, since it should include resist-printing whenever a color needs to be changed to form a multicolored thin film on the same substrate. In addition, many generally-used dyes and resins may have good color vividness and dispersion but also poor color fastness, water resistance, and heat resistance, which are very important characteristics.

The printing method forms a colored thin film by printing an ink prepared by dispersing a pigment into a thermally curable or photocurable resin and curing the resin with the pigment dispersed therein with heat or light. This method may decrease material costs compared with other methods. It can be difficult, however, to form a fine and precise image and acquire a uniform thin film layer using printing methods.

Korean Patent Laid-Open Publication No. 1996-0011513 discloses formation of a color filter in an inkjet method. However, the resultant color filter suffers problems similar to that of a color filter made by dyeing, for example, deteriorated durability and heat resistance, because this method also uses a dye-type color resist composition dispersed from a nozzle to accomplish fine and precise color printing. Korean Patent Laid-Open Publication No. 1996-0029904 discloses formation of a color filter in an electrophoretic deposition (EPD) method including an electrical precipitation method. The electrophoretic deposition (EPD) method may provide a precisely-colored thin film with excellent heat resistance and color fastness, since it uses a pigment. However, this method may not be useful for fabricating a highly precise color filter requiring a finer electrode pattern for a more precise pixel in the future, because the colored thin film may be stained or thicker at both ends due to electrical resistance.

In contrast, the pigment dispersion method forms a colored film by repeating a series of processes such as coating, patternwise-exposing to light, removing non-exposed part by using a solvent, and heat-curing a photopolymer composition including a coloring agent on a transparent substrate including a black matrix. This method can improve heat resistance and durability, which are very important characteristics for a color filter, and thus, can provide a uniformly-thick film.

However, the pigment dispersion method cannot provide color characteristics, such as luminance, contrast ratio, and the like, currently required in various products. Accordingly, there is a need for a method for making a color filter that can minimize or eliminate deteriorated contrast ratio and additionally provide high luminance.

SUMMARY OF THE INVENTION

The present invention provides a photosensitive resin composition for a color filter that can have excellent heat resistance, good color characteristics such as high luminance and/or high contrast ratio, and/or excellent coating properties.

The present invention further provides a color filter manufactured using the photosensitive resin composition for a color filter.

In the present invention, color characteristics of a composition including a pigment may be improved by introducing a dye with high durability and with a small primary particle diameter of several nanometers or no particles in a solution state.

Without being bound by any explanation of the invention, the inventors currently believe that conventional compositions for a color filter including a pigment can exhibit deteriorated contrast ratio and/or poor luminance due to the properties of the pigment particle. In contrast, in the present invention, when a highly durable dye with no particles or very small primary particle diameter is used in a predetermined amount instead of more pigments, the photosensitive resin composition can provide higher luminance and higher contrast ratio than a composition including just a pigment dispersion solution. The photosensitive resin composition can also maintain the conventional thickness of a pixel. Accordingly, the present invention may provide a photosensitive resin composition useful for the production of a color filter with appropriate color spectrum characteristics determined using color coordinate systems such as SRGB (standard Red Green Blue), NTSC (National Television System Committee), and EBU (Europien Broadcasting Union) criteria and simultaneously can provide high luminance and high contrast ratio performance in a desired color coordinate by including a particular dye. As a result, the present invention may provide a color filter for LCDs and LEDs having high luminance and high contrast ratio performance in a desired color coordinate.

The photosensitive resin composition for a color filter of one embodiment of the present invention includes (A) an organic salt-type sulfonate-containing dye; (B) a pigment; (C) an acryl-based binder resin; (D) a photopolymerizable monomer; (E) a photopolymerization initiator; and (F) a solvent.

The dye may be represented by the following Chemical Formula 1.

[Chemical Formula 1]

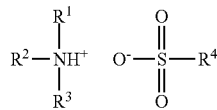

In Chemical Formula 1, $R^1$ to $R^3$ are each independently hydrogen, substituted or unsubstituted C1 to C20 alkyl, substituted or unsubstituted C3 to C20 cycloalkyl, or a combination thereof, with the proviso that all of $R^1$ to $R^3$ are not hydrogen, and $R^4$ is substituted or unsubstituted C1 to C20 heteroalkyl, substituted or unsubstituted C3 to C20 heterocycloalkyl, substituted or unsubstituted C3 to C20 heteroaryl, or a combination thereof and includes an imine group, an azo group, a pyrazolone group, a fuchsine group, an anthraquinone group, or a combination thereof.

The dye represented by Chemical Formula 1 may include an ammonium ion such as a trioctylammonium ion, a tridodecylammonium ion, or a dioctylammonium ion.

The dye represented by Chemical Formula 1 may include a sulfonate such as:
2,5-dichloro-4-4,5-dihydro-3-methyl-5-oxo-4-(4-sulfophenyl)azo-1H-pyrazol-1-yl-benzenesulfonate,
4-chloro-3-[4,5-dihydro-3-methyl-5-oxo-4-[[3-[(phenylamino)sulfonyl]phenyl]azo]-1H-pyrazol-1-yl]-benzenesulfonate,
3-[[4-(phenylamino)phenyl]azo]-benzenesulfonate,
[1,1'-biphenyl]-2,2'-disulfonate,
4,4'-bis[(4,5-dihydro-3-methyl-5-oxo-1-phenyl-1H-pyrazol-4-yl)azo]-benzene sulfonate,
hydroxy[2-hydroxy-5-nitro-3-[[2-oxo-1-[(phenylamino)carbonyl]propyl]azo]benzenesulfonato (3-)]-chromate (1-),
4-[[4-[(4-hydroxy-2-methylphenyl)azolphenyl]amino]-3-nitro-benzenesulfonate,
2-amino-5-[(4-amino-3-sulfophenyl)(4-imino-3-sulfo-2,5-cyclohexadien-1-ylidene)methyl]-3-methyl-benzenesulfonate,
N-[4-[[4-(dimethylamino)phenyl][4-[ethyl[(3-sulfophenyl)methyl]amino]phenyl]methylene]-2,5-cyclohexadien-1-ylidene]-N-ethyl-3-sulfo-benzenemethanaminium, or a combination thereof.

The pigment may include without limitation a dipyrrolopyrrole-based red pigment, a halogen-substituted copper phthalocyanine-based green pigment, a halogen-substituted zinc phthalocyanine-based green pigment, a copper phthalocyanine-based blue pigment, an isoindoline-based yellow pigment, a quinophthalone-based yellow pigment, a nickel complex-based yellow pigment, or a combination thereof.

Examples of the pigment may include without limitation a C.I. red pigment 254, a C.I. red pigment 255, a C.I. red pigment 264, a C.I. red pigment 270, a C.I. red pigment 272, a C.I. red pigment 177, a C.I. red pigment 89, a C.I. green pigment 36, a C.I. green pigment 7, a C.I. green pigment 58, a C.I. blue pigment 15:6, a C.I. blue pigment 15, a C.I. blue pigment 15:1, a C.I. blue pigment 15:2, a C.I. blue pigment 15:3, a C.I. blue pigment 15:4, a C.I. blue pigment 15:5, a C.I. blue pigment 16, a C.I. yellow pigment 139, a C.I. yellow pigment 138, a C.I. yellow pigment 150, and the like, and combinations thereof.

The photosensitive resin composition for a color filter may include the dye and the pigment in a weight ratio of about 1:99 to about 99:1.

The photosensitive resin composition for a color filter may include: about 0.1 wt % to about 20 wt % of the dye (A); about 0.1 wt % to about 30 wt % of the pigment (B); about 0.5 wt % to about 15 wt % of the acrylic-based binder resin (C); about 0.5 wt % to about 15 wt % of the photopolymerizable monomer (D); about 0.01 wt % to about 5 wt % of the photopolymerization initiator (E); and a balance amount of the solvent (F).

Another embodiment of the present invention provides a color filter manufactured using the photosensitive resin composition for a color filter.

Further embodiments of the present invention are described in the detailed description.

Therefore, the present invention provides a photosensitive resin composition for a color filter that can have excellent heat resistance, high luminance and/or contrast ratio, and/or excellent coating properties and a color filter that can exhibit excellent color characteristics by including the same.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not provided, the term "alkyl" refers to C1 to C20 alkyl, the term "heteroalkyl" refers to C1 to C20 heteroalkyl, the term "cycloalkyl" refers to C3 to C20 cycloalkyl, the term "heterocycloalkyl" refers to C2 to C20 heterocycloalkyl, the term "aryl" refers to C6 to C30 aryl, and the term "heteroaryl" refers to C2 to C30 heteroaryl.

As used herein, when a definition is not otherwise provided, the term "substituted" refers to one substituted with a substituent such as a halogen (F, Br, Cl, or I), a hydroxy group, a nitro group, a cyano group, an amino group (—NRR', wherein R and R' are each independently a C1 to C10 alkyl group), an amidino group, a hydrazine or hydrazone group, a carboxyl group, a substituted or unsubstituted alkyl group, a substituted or unsubstituted aryl group, a substituted or unsubstituted cycloalkyl group, a substituted or unsubstituted heteroalkyl group, a substituted or unsubstituted heteroaryl group, a substituted or unsubstituted heterocycloalkyl group, or a combination thereof, in place of a hydrogen, one substituted with a substituent such as =O, =S, =NR (wherein R is a C1 to C10 alkyl group), =PR (wherein R is a C1 to C10 alkyl group), =CRR' (wherein R and R' are independently a C1 to C10 alkyl group) or a combination thereof in place of two hydrogens, and one substituted with a substituent such as ≡N, ≡P, ≡CR (wherein R is a C1 to C10 alkyl group) or a combination thereof, in place of three hydrogens.

As used herein, when a specific definition is not otherwise provided, the terms heteroalkyl, heterocycloalkyl, and heteroaryl refer to alkyl, cycloalkyl, and aryl, respectively, in which 1 to 3 carbon atoms are replaced with 1 to 3 heteroatoms comprising N, O, S, Si, P, or a combination thereof.

As used herein in this specification, "a combination" refers to a mixture or a copolymerization, unless otherwise defined.

The photosensitive resin composition for a color filter according to one embodiment of the present invention includes: (A) an organic salt-type sulfonate-containing dye; (B) a pigment; (C) an acrylic-based binder resin; (D) a photopolymerizable monomer; (E) a photopolymerization initiator; and (F) a solvent.

The photosensitive resin composition for a color filter may further include (G) one or more other additives such as a surfactant and the like.

Hereinafter, each component of the photosensitive resin composition for a color filter according to one embodiment is described.

(A) Dye

The dye includes an organic salt-type sulfonate-containing dye but may be mixed with other dyes if needed.

The dye may be represented by the following Chemical Formula 1.

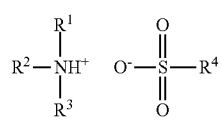

[Chemical Formula 1]

In Chemical Formula 1, $R^1$ to $R^3$ are each independently, hydrogen, substituted or unsubstituted C1 to C20 alkyl, substituted or unsubstituted C3 to C20 cycloalkyl, or combination thereof, with the proviso that all of $R^1$ to $R^3$ are not hydrogen, and $R^4$ is substituted or unsubstituted C1 to C20 heteroalkyl, substituted or unsubstituted C2 to C20 heterocycloalkyl, substituted or unsubstituted C2 to C20 heteroaryl, or a combination thereof and includes an imine group, an azo group, a pyrazolone group, a fuchsine group, an anthraquinone group, or a combination thereof.

The dye represented by Chemical Formula 1 may include an ammonium ion such as an alkyl ammonium ion. Examples of the alkyl ammonium ion include a trioctylammonium ion, a tridodecylammonium ion, a dioctylammonium ion, and the like, and combinations thereof, but is not limited thereto.

The dye represented by Chemical Formula 1 may include a sulfonate such as but not limited to 2,5-dichloro-4-4,5-dihydro-3-methyl-5-oxo-4-(4-sulfophenyl)azo-1H-pyrazol-1-yl-benzenesulfonate,
4-chloro-3-[4,5-dihydro-3-methyl-5-oxo-4-[[3-[(phenylamino)sulfonyl]phenyl]azo]-1H-pyrazol-1-yl]benzenesulfonate,
3-[[4-(phenylamino)phenyl]azo]-benzenesulfonate,
[1,1-biphenyl]-2,2'-disulfonate,
4,4'-bis[(4,5-dihydro-3-methyl-5-oxo-1-phenyl-1H-pyrazol-4-yl)azo]-benzenesulfonate,
hydroxy[2-hydroxy-5-nitro-3-[[2-oxo-1-[(phenylamino)carbonyl]propyl]azo]benzenesulfonate (3-)]-chromate (1-),
4-[[4-[(4-hydroxy-2-methylphenyl)azolphenyl]amino]-3-nitro-benzenesulfonate,
(2-amino-5-[(4-amino-3-sulfophenyl)(4-imino-3-sulfo-2,5-cyclohexadien-1-ylidene)methyl]-3-methyl-benzenesulfonate,
N-[4-[[4-(dimethylamino)phenyl][4-[ethyl[(3-sulfophenyl)methyl]amino]phenyl]methylene]-2,5-cyclohexadien-1-ylidene]-N-ethyl-3-sulfo-benzenemethanaminium), or a combination thereof.

The photosensitive resin composition for a color filter may include the dye in an amount of about 0.1 wt % to about 20 wt %, for example about 5 wt % to about 15 wt %, based on the total weight of the photosensitive resin composition for a color filter. In some embodiments, the photosensitive resin composition may include the dye in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the dye can be in a range from about any of the foregoing amounts to about any other of the foregoing amounts.

When the dye is included in an amount within these ranges, the composition may provide high luminance at the same color coordinates.

(B) Pigment

The photosensitive resin composition for a color filter may have a pigment having a color such as red, green, blue, yellow, or violet color.

Examples of the pigment may include without limitation an anthraquinone-based pigment, a condensation polycyclic pigment such as a perylene-based one and the like, a phthalocyanine pigment, an azo-based pigment, and the like. The pigment may be used singularly or in a combination of two or more. A combination of two or more pigments can allow adjustment of maximum absorption wavelength, cross point, crosstalk, and the like.

Examples of the pigment may include without limitation a dipyrrolopyrrole-based red pigment, a halogen-substituted copper phthalocyanine-based green pigment, a halogen-substituted zinc phthalocyanine-based green pigment, a copper phthalocyanine-based blue pigment, an isoindoline-based yellow pigment, a quinophthalone-based yellow pigment, a nickel complex-based yellow pigment, and the like, and combinations thereof. Among them, the pigment may include without limitation a C.I. red pigment 254, a C.I. red pigment 255, a C.I. red pigment 264, a C.I. red pigment 270, a C.I. red pigment 272, a C.I. red pigment 177, a C.I. red pigment 89, a C.I. green pigment 36, a C.I. green pigment 7, a C.I. green pigment 58, a C.I. blue pigment 15:6, a C.I. blue pigment 15, a C.I. blue pigment 15:1, a C.I. blue pigment 15:2, a C.I. blue pigment 15:3, a C.I. blue pigment 15:4, a C.I. blue pigment 15:5, a C.I. blue pigment 16, a C.I. yellow pigment 139, a C.I. yellow pigment 138, a C.I. yellow pigment 150, or a combination thereof.

The pigment may be included in the photosensitive resin composition for a color filter as a pigment itself or a pigment dispersion composition including the pigment, a dispersing agent, a solvent, and a resin.

Examples of the dispersing agent in the pigment dispersion composition may include without limitation a non-ionic dispersing agent, an anionic dispersing agent, a cationic dispersing agent, and the like, and combinations thereof.

Examples of the dispersing agent include without limitation polyalkylene glycols and esters thereof; polyoxyalkylenes; polyhydric alcohol ester alkyleneoxide addition products; alcohol alkyleneoxide addition products; alkylamines, and the like. These dispersing agents may be used singularly or in a combination of two or more. The pigment dispersion composition may include the dispersing agent(s) in an amount of about 10 parts by weight to about 20 parts by weight based on 100 parts by weight of a pigment in the pigment dispersion composition. In some embodiments, the pigment dispersion composition may include the dispersing agent in an amount of about 10, 11, 12, 13, 14, 15, 16, 17, 18, 19, or 20 parts by weight. Further, according to some embodiments of the present invention, the amount of the dispersing agent can be in a range from about any of the foregoing amounts to about any other of the foregoing amounts.

Examples of the solvent of the pigment dispersion composition may include without limitation ethylene glycol acetate, ethylcellosolve, propylene glycol methylether acetate, ethyl lactate, polyethylene glycol, cyclohexanone, propylene glycol methylether, and the like, and combinations thereof.

In addition, a carboxyl-containing acrylic-based resin as well as the dispersing agent may be added to the pigment in order to improve stability of a pigment dispersion composition and a pixel pattern.

The pigment can have a primary particle diameter ranging from about 10 to about 70 nm. In some embodiments, the pigment may have a primary particle diameter of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 nm. Further, according to some embodiments of the present invention, the primary particle diameter of the pigment can be in a range from about any of the foregoing sizes to about any other of the foregoing sizes. When the pigment has a primary particle diameter within the above ranges, the pigment dispersion composition can have excellent stability and the pigment may not deteriorate pixel resolution.

There is no particular limitation with regard to the secondary particle diameter of the pigment. In exemplary embodiments, the pigment may have a secondary particle diameter of about 200 nm or less, taking into consideration desired pixel resolution. In an exemplary embodiment, the pigment may have a secondary particle diameter ranging from about 70 to about 100 nm.

The photosensitive resin composition may include the pigment in an amount of about 0.1 wt % to about 30 wt %, for example about 5 wt % to about 20 wt %, based on the total weight of the photosensitive resin composition. In some embodiments, the photosensitive resin composition may include the pigment in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the pigment can be in a range from about any of the foregoing amounts to about any other of the foregoing amounts. When the pigment is included in an amount within these ranges, the composition may provide excellent color reproducibility, pattern formation, curing characteristic, and/or adherence.

When the dye and the pigment are used as a mixture, they may be mixed in a weight ratio ranging from about 1:99 to about 99:1, for example about 5:95 to about 30:70. In some embodiments, the mixture of the dye and the pigment may include the dye in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the dye in the mixture of the dye and pigment can be in a range from about any of the foregoing amounts to about any other of the foregoing amounts.

In some embodiments, the mixture of the dye and the pigment may include the pigment in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the pigment in the mixture of the dye and pigment can be in a range from about any of the foregoing amounts to about any other of the foregoing amounts.

When the dye and the pigment are mixed in an amount within the above weight ratio ranges, the composition may have high luminance and high contrast ratio as well as maintain color characteristics.

(C) Acrylic-Based Binder Resin

The acrylic-based binder resin includes a copolymer of a first ethylenic unsaturated monomer and a second ethylenic unsaturated monomer copolymerizable with the first ethylenic unsaturated monomer and includes at least one of acrylic-based repeating units.

The first ethylenic unsaturated monomer can be an ethylenic unsaturated monomer including more than one carboxyl group. Examples of the first ethylenic unsaturated monomer can include, but are not limited to, acrylic acid, methacrylic acid, maleic acid, itaconic acid, fumaric acid, and the like, and combinations thereof.

The copolymer may include the first ethylenic unsaturated monomer in an amount of about 10 to about 40 wt %, for example about 20 to about 30 wt %, based on the total weight of the acrylic-based binder resin. In some embodiments, the copolymer may include the first ethylenic unsaturated monomer in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer can include, but are not limited to, alkenyl aromatic monomers, unsaturated carboxylic acid ester compounds, unsaturated carboxylic acid amino alkyl ester compounds, carboxylic acid vinyl ester compounds, unsaturated carboxylic acid glycidyl ester compounds, vinyl cyanide compounds, unsaturated amide compounds, and the like, and combinations thereof.

Examples of the alkenyl aromatic monomer may include without limitation styrene, α-methyl styrene, vinyl toluene, vinyl benzylmethylether, and the like. Examples of the unsaturated carboxylic acid ester-based compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like. Examples of the unsaturated carboxylic acid amino alkyl ester-based compound may include without limitation 2-amino ethyl acrylate, 2-amino ethyl methacrylate, 2-dimethyl amino ethyl acrylate, 2-dimethyl amino ethyl methacrylate, and the like. Examples of the carboxylic acid vinyl ester-based compound may include without limitation vinyl acetate, vinyl benzoate, and the like. Examples of the unsaturated carboxylic acid glycidyl ester-based compound may include without limitation glycidyl acrylate, glycidyl methacrylate, and the like. Examples of the vinyl cyanide compound may include without limitation acrylonitrile, methacrylonitrile, and the like. Examples of the unsaturated amide-based compound may include without limitation acryl amide, methacryl amide, and the like. These unsaturated monomers may be used singularly or in a mixture of two or more.

Examples of the acrylic-based binder resin including the first ethylenic unsaturated monomer and the second ethylenic unsaturated monomer may include without limitation a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, a methacrylic acid/benzyl methacrylate/styrene/2-hydroxy ethyl methacrylate copolymer, and the like. These acrylic-based binder resins may be used singularly or in a mixture of two or more.

The acrylic-based binder resin may have a weight average molecular weight ranging from about 3,000 to about 150,000, for example about 20,000 to about 30,000. When the acrylic-based binder resin has a weight average molecular weight within these ranges, it may improve the adherence property of a composition to a substrate and provide excellent physical and chemical properties and adequate viscosity.

The acrylic-based binder resin is a main factor affecting the resolution of a pixel in the photosensitive resin composition for a color filter. For example, when the acrylic-based binder resin is a methacrylic acid/benzylmethacrylate copolymer, it may remarkably improve resolution of a pixel according to an acid value and a weight average molecular weight. When the methacrylic acid/benzyl methacrylate copolymer is included in a ratio of 25/75 (w/w) and thus, has an acid value ranging from 80 to 120 mg KOH/g and a weight average molecular weight ranging from 20,000 to 30,000, it may accomplish high resolution of a pixel.

The photosensitive resin composition may include the acrylic-based binder resin in an amount of about 0.5 wt % to about 15 wt % based on the total weight of the photosensitive resin composition for a color filter. In some embodiments, the photosensitive resin composition may include the acrylic-based binder resin in an amount of about 0.5, 0.6, 0.7, 0.8, 0.9, 1, 2, 3, 4, 5, 6, 7, 8, 9, 10, 11, 12, 13, 14, or 15 wt %. Further, according to some embodiments of the present invention, the amount of the acrylic-based binder resin can be in a range from about any of the foregoing amounts to about any other of the foregoing amounts.

When the acrylic-based binder resin is included in an amount within the range, a resulting composition may provide good adherence to a substrate, a uniformly thick layer, and excellent color filter post-process properties such as film strength, heat resistance, chemical resistance, after-image, and the like. In addition, the composition may have proper cross-linking and thus can provide excellent panel flatness on the surface.

(D) Photopolymerizable Monomer

The photopolymerizable monomer may include a multi-functional monomer with more than two hydroxyl groups. Examples of the photopolymerizable monomer may include without limitation glycerolacrylate, dipentaerythritolhexaacrylate, ethyleneglycoldiacrylate, triethyleneglycoldiacrylate, 1,4-butanedioldiacrylate, 1,6-hexanedioldiacrylate, neopentylglycoldiacrylate, pentaerythritoldiacrylate, pentaerythritoltriacrylate, pentaerythritol diacrylate, dipentaerythritoltriacrylate, dipentaerythritolacrylate, pentaerythritolhexaacrylate, bisphenolAdiacrylate, trimethylolpropanetriacrylate, novolacepoxyacrylate, ethyleneglycoldimethacrylate, diethyleneglycoldimethacrylate, triethyleneglycoldimethacrylate, propyleneglycoldimethacrylate, 1,4-butanedioldimethacrylate, 1,6-hexanedioldimethacrylate, and the like, and combinations thereof.

The photosensitive resin composition for a color filter may include the photopolymerizable monomer in an amount of about 0.5 wt % to about 15 wt %, for example about 1 wt % to about 10 wt %, based on the total weight of the photosensitive resin composition for a color filter. In some embodiments, the photosensitive resin composition may include the photopolymerizable monomer in an amount of about 0.5, 0.6, 0.7, 0.8, 0.9, 1, 2, 3, 4, 5, 6, 7, 8, 9, 10, 11, 12, 13, 14, or 15 wt %. Further, according to some embodiments of the present invention, the amount of the photopolymerizable monomer can be in a range from about any of the foregoing amounts to about any other of the foregoing amounts.

When the photopolymerizable monomer is included in an amount within these ranges, the composition may provide excellent pattern characteristics and development properties.

(E) Photopolymerization Initiator

The photopolymerization initiator may be any generally-used photopolymerization initiator for a photosensitive resin composition. Examples of the photopolymerization initiator can include without limitation a triazine-based compound, an acetophenone-based compound, a biimidazole-based compound, an active radical generating agent, an acid generating agent, and the like, and combinations thereof.

Examples of the triazine-based compound of the photopolymerization initiator may include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl)-1,3,5-triazine, 2,4,6-trichloro-s-triazine, 2-phenyl-4,6-bis(trichloromethyl)-s-triazine, 2-(3',4'-dimethoxy styryl)-4,6-bis(trichloromethyl)-s-triazine, 2-(4'-methoxy naphthyl)-4,6-bis(trichloromethyl)-s-triazine, 2-(p-methoxy phenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphtho-1-yl)-4,6-bis(trichloro methyl)-s-triazine, 2-(4-methoxy naphtho-1-yl)-4,6-bis(trichloro methyl)-s-triazine, 2-4-trichloro methyl(piperonyl)-6-triazine, 2-4-trichloro methyl (4'-methoxy styryl)-6-triazine, and the like, and combinations thereof. In exemplary embodiments, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine or 2,4-bis(trichloromethyl)-6-piperonyl-1,3,5-triazine, may be used.

Examples of the acetophenone-based compound may include without limitation diethoxyacetophenone, 2-methyl-2-morpholino-1-(4-methylthiophenyl)propan-1-one, 2-hydroxy-2-methyl-1-phenylpropan-1-one, benzyldimethylketal, 2-hydroxy-2-methyl-1-[4-(2-hydroxyethoxy)phenyl]propan-1-one, 1-hydroxycyclohexylphenylketone, 2-benzyl-2-dimethylamino-1-(4-morpholinophenyl)butan-1-one, 2-(4-methylbenzyl)-2-dimethylamino-1-(4-morpholinophenyl)butan-1-one, 2-hydroxy-2-methyl-1-[4-(1-methylvinyl)phenyl]propan-1-one, and the like, and among them, 2-methyl-2-morpholino-1-(4-methylthiophenyl)propan-1-one, 2-benzyl-2-dimethylamino-1-(4-morpholinophenyl)butan-1-one or 2-(4-methylbenzyl)-2-dimethylamino-1-(4-morpholinophenyl)butan-1-one, particularly, 2-benzyl-2-dimethylamino-1-(4-morpholinophenyl)butan-1-one or 2-(4-methylbenzyl)-2-dimethylamino-1-(4-morpholinophenyl)butan-1-one, and the like, and combinations thereof.

Examples of the biimidazole-based compound may include without limitation 2,2'-bis(2-chlorophenyl)-4,4',5,5'-tetraphenylbiimidazole, 2,2'-bis(2-chlorophenyl)-4,4',5,5'-tetra(4-carboethoxyphenyl)biimidazole, 2,2',-bis(2-chlorophenyl)-4,4',5,5'-tetra(4-bromophenyl)biimidazole, 2,2'- bis(2-chlorophenyl)-4,4',5,5'-tetra(2,4-dichlorophenyl) biimidazole, 2,2'-bis(2-bromophenyl)-4,4',5,5'-tetraphenylbiimidazole, 2,2'-bis(2,4-dichlorophenyl)-4,4',5,5'-tetraphenylbiimidazole, 2,2'-bis(2-chlorophenyl)-4,4',5,5'-tetra(m-methoxyphenyl)biimidazole, 2,2'-bis(2,3-dichlorophenyl)-4,4',5,5'-tetraphenylbiimidazole, 2,2'-bis(2,6-dichlorophenyl)-4,4',5,5'-tetraphenylbiimidazole, 2,2'-bis(2-nitrophenyl)-4,4',5,5'-tetraphenylbiimidazole 2,2'-bis(2-methylphenyl)-4,4',5,5'-tetraphenylbiimidazole, and the like, and combinations thereof. In exemplary embodiments, 2,2'-bis(2-chlorophenyl)-4,4',5,5'-tetraphenylbiimidazole or 2,2'-bis(2,3-dichlorophenyl)-4,4',5,5'-tetraphenylbiimidazole may be used.

The active radical-generating agent generates an active radical when exposed to radiation. Examples of the active radical-generating agent may include without limitation a benzoin-based compound, a benzophenone-based compound, a thioxanthone-based compound, an oxime-based compound, and the like, and combinations thereof.

Examples of the benzoin-based compound may include without limitation benzoin, benzoin methylether, benzoin ethylether, benzoin isopropylether, benzoin isobutylether, and the like, and combinations thereof.

Examples of the benzophenone-based compound may include without limitation benzophenone, benzoyl benzoate, o-benzoyl methyl benzoate, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino) benzophenone, 4,4'-bis(diethylamino) benzophenone, 4-benzoyl-4'-methyldiphenylsulfide, 3,3',4,4'-tetra(tert-butylperoxycarbonyl)benzophenone, 2,4,6-trimethylbenzophenone, and the like, and combinations thereof.

Examples of the thioxanthone-based compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chloro thioxanthone, 1-chloro-4-propoxythioxantone, and the like, and combinations thereof.

Examples of the oxime-based compound may include without limitation O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like, and combinations thereof. Examples of the O-acyloxime-based compound may include without limitation 1-(4-phenylsulfanylphenyl)-butan-1,2-dione2-oxime-O-benzoate, 1-(4-phenylsulfanylphenyl)-octan-1,2-dione2-oxime-O-benzoate, 1-(4-phenylsulfanylphenyl)-octan-1-oneoxime-O-acetate and 1-(4-phenylsulfanylphenyl)-butan-1-oneoxime-O-acetate, and the like, and combinations thereof.

Other active radical generating agents except for the above examples may include without limitation 2,4,6-trimethylbenzoyl diphenylphosphine oxide, 10-butyl-2-chloroacridone, 2-ethylanthraquinone, benzyl, 9,10-phenanthrenequinone, camphor quinone, phenyl methyl glyoxylate, a titanocene compound, and the like, and combinations thereof.

Other polymerization initiators may include without limitation a carbazole-based compound, a diketone-based compound, a sulfonium borate-based compound, a diazo-based compound, and the like, and combinations thereof. In addition, since the polymerization initiator absorbs light and is excited and then, transmits energy, it may be used with a photo-sensitizer causing a chemical reaction.

The photosensitive resin composition for a color filter may include the photopolymerization initiator in an amount of about 0.01 wt % to about 5 wt %, for example about 0.1 wt % to about 3 wt %, based on the total weight of the photosensitive resin composition for a color filter. In some embodiments, the photosensitive resin composition for a color filter may include the photopolymerization initiator in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

In exemplary embodiments, when a triazine-based compound is used as the photopolymerization initiator, it may be used in an amount of about 15 wt % or less based on the total weight of a photopolymerization initiator. When the photopolymerization initiator is used in an amount within these ranges, the composition may sufficiently photopolymerize during exposure in the pattern forming process and thus can have excellent sensitivity and improved transmittance.

(F) Solvent

The solvent is compatible with the acrylic-based binder resin and other component materials but does not react therewith.

Examples of the solvent may include without limitation alcohol compounds such as methanol, ethanol, and the like; ether compounds such as dichloroethyl ether, n-butyl ether, diisoamyl ether, methylphenyl ether, tetrahydrofuran, and the like; glycol ether compounds such as ethylene glycol monomethylether, ethylene glycol monoethylether, and the like; cellosolve acetate compounds such as methyl cellosolve acetate, ethyl cellosolve acetate, diethyl cellosolve acetate, and the like; carbitol compounds such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetate compounds such as propylene glycol methylether acetate, propylene glycol propylether acetate, and the like; aromatic hydrocarbon compounds such as toluene, xylene, and the like; ketone compounds such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester compounds such as ethyl acetate, n-butyl acetate, isobutyl acetate, and the like; lactic acid alkyl ester compounds such as methyl lactate, ethyl lactate, and the like; hydroxyacetic acid alkyl ester compounds such as methyl hydroxyacetate, ethyl hydroxyacetate, butyl hydroxyacetate, and the like; acetic acid alkoxyalkyl ester compounds such as methoxymethyl acetate, methoxyethyl acetate, methoxybutyl acetate, ethoxymethyl acetate, ethoxyethyl acetate, and the like; 3-hydroxypropionic acid alkyl ester compounds such as methyl 3-hydroxypropionate, ethyl 3-hydroxypropionate, and the like; 3-alkoxypropionic acid alkyl ester compounds such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl ester compounds such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; ester compounds such as 2-hydroxyethyl propionate, 2-hydroxy-2-methylethyl propionate, hydroxyethyl acetate, methyl 2-hydroxy-3-methylbutanoate, and the like; and ketone acid ester compounds such as ethyl pyruvate, and the like. In addition, it may include a solvent with a high boiling point such as N-methyl formamide, N,N-dimethyl formamide, N-methyl formanilide, N-methyl acetamide, N,N-dimethyl acetamide, N-methylpyrrolidone, dimethyl sulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl malate, γ-butyrolactone, ethylene carbonate, propylene carbonate, phenyl cellosolve acetate, and the like, and combinations thereof.

Among these solvents, a glycol ether compound such as ethylene glycol monoethyl ether and the like; an ethylene glycol-alkylether acetate compound such as ethyl cellosolve acetate and the like; an ester compound such as 2-hydroxy ethyl propionate and the like; a diethylene glycol compound such as diethylene glycol monomethyl ether and the like; a propylene glycol-alkylether acetate compound such as propylene glycol methylether acetate, propylene glycol propylether acetate, and the like are used, taking into account compatibility, reactivity, and the like. In exemplary embodiments, the solvent may include cyclohexanone in an amount of about 10 wt % to about 50 wt % based on the entire weight of the solvent, taking into consideration the solubility of a dye.

The solvent may be used in a balance amount based on the total weight of the photosensitive resin composition for a color filter after adding other components in order to appropriately adjust solubility and viscosity and bring about good physical and optical characteristics to a product.

(G) Other Additive(s)

The photosensitive resin composition for a color filter may further include one or more additives, such as but not limited to a surfactant to disperse the pigment uniformly in the solvent and to improve leveling performance.

The surfactant may include a fluorine-based surfactant.

The fluorine-based surfactant may have a low weight average molecular weight ranging from about 4,000 to about 10,000, for example about 6,000 to about 10,000. In addition, the fluorine-based surfactant may have a surface tension ranging from about 18 mN/m to about 23 mN/m (measured in a 0.1 wt % polyethyleneglycol methyletheracrylate (PEGMEA) solution). When the fluorine-based surfactant has a weight average molecular weight and a surface tension within these ranges, it may improve leveling performance. In addition, it may be good for slit coating, because it has excellent stain characteristic during the high speed coating and produces small vapors and thus, decreases layer defects.

Examples of the fluorine-based surfactant may include without limitation F-482, F-484, F-478, and the like, and combinations thereof, made by DIC Inc.

The surfactant may include a silicon-based surfactant as well as the fluorine-based surfactant.

The silicon-based surfactant may include a surfactant having a siloxane bond and the like. Examples of the silicon-based surfactant may include without limitation DC3PA, SH7PA, DC11PA, SH21PA, SH28PA, 29SHPA, and SH30PA made by Toray Silicone Co., Ltd.; a polyester-modified silicone oil, made by Toray Silicone Co., Ltd.; KP321, KP322, KP323, KP324, KP326, KP340, GF made by Shin-Etsu Silicone Chemical Industry Co., Ltd.; TSF400, TSF401, TSF410, TSF4440, TSF4445, TSF4446, TSF4452, TSF4460 made by Toshiba Silicones Co., Ltd.; and the like, and combinations thereof.

The photosensitive resin composition for a color filter may include the surfactant in an amount ranging from about 0.01 wt % to about 5 wt %, for example about 0.1 wt % to about 2 wt %, based on 100 parts by weight of the photosensitive resin composition for a color filter. In some embodiments, the photosensitive resin composition for a color filter may include the surfactant in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 wt %. Further, according to some embodiments of the present invention, the amount of the surfactant can be in a range from about any of the foregoing amounts to about any other of the foregoing amounts.

When the surfactant is included in an amount within these ranges, it may decrease impurities after the development.

The photosensitive resin composition for a color filter may further include a dispersing agent as aforementioned to uniformly disperse (B) a pigment component in (F) a solvent other than the (A) to (F) components. The dispersing agent may include a non-ionic, anionic, or cationic dispersing agent, such as but not limited to polyalkylene glycols and esters thereof, polyoxyalkylenes, polyhydric alcohol ester alkylene oxide addition products, alcohol alkylene oxide addition products, sulfonic acid esteres, sulfonic acid salts, carboxylic acid esteres, carboxylic acid salts, alkylamidealkyleneoxide addition products, alkylamines, and the like. These dispersing agents may be used singularly or a mixture of more than two.

In addition, the composition may further include other additives such as but not limited to an epoxy compound; malonic acid; 3-amino-1,2-propanediol; a silane-based coupling agent with a vinyl group or a (meth)acryloxy group; a leveling agent; a silicon-based surfactant; a fluorine-based surfactant; a radical polymerization initiator; and the like and combinations thereof, in order to prevent a stain or a spot during the coating and generation of a residue due to non-development and to control leveling. The amount of these additives may be easily adjusted by the skilled artisan depending on a desired property.

Examples of the epoxy compound may include without limitation phenol novolac epoxy resins, tetra methyl nonphenyl epoxy resins, bisphenol A-type epoxy resins, alicyclic epoxy resins, ortho-cresol novolac resins, and the like, and combinations thereof. The photosensitive resin composition may include the epoxy compound in an amount ranging from about 0.01 to about 5 parts by weight, based on 100 parts by weight of the photosensitive resin composition. When the epoxy compound is included in an amount within this range, it may provide excellent storage and process margin.

When the epoxy compound is included, a radical polymerization initiator such as a peroxide initiator or an azobis-based initiator may be further included.

Examples of the peroxide initiator may include without limitation isobutylperoxide, 2,4-dichlorobenzoylperoxide, α-methylbenzoylperoxide, diisopropylbenzenehydroperoxide, cumenehydroperoxide, tert-butylhydroperoxide, 1,1,3,3,-tetramethylbutylhydroperoxide, 2,5-dimethyl-2,5-di(tert-butylperoxy)hexane, 1,3-bis(tert-butylperoxyisopropyl)benzene, dicumylperoxide, di-tert-butylperoxide, paramenthanehydroperoxide, tert-butylcumylperoxide, di-tert-hexylperoxide, tert-butylperoxy acetate, 2,4,4-trimethylpentylperoxyphenoxyacetate, t-butylperoxybenzoate, 2,2-di-(tert-butylperoxy)butane, di-tert-methoxybutylperoxydicarbonate, di-2-ethylhexylperoxydicarbonate and diisopropylperoxydicarbonate, and the like, and combinations thereof. In exemplary embodiments, diisopropylbenzenehydroperoxide, cumenehydroperoxide, tert-butylhydroperoxide, 1,1,3,3,-tetramethylbutylhydroperoxide, 2,5- dimethyl-2,5-di(tert-butylperoxy)hexane, dicumylperoxide, di-tert-butylperoxide, paramenthanehydroperoxide, tert-butylcumylperoxide, di-tert-hexylperoxide, tert-butylperoxyacetate, t-butylperoxybenzoate or 2,2-di-(tert-butylperoxy) butane, particularly, dicumylperoxide, di-tert-hexylperoxide, tert-butylcumylperoxide, di-tert-butylperoxide, paramenthanehydroperoxide, diisopropylbenzenehydroperoxide, 1,1,3,3,-tetramethylbutylhydroperoxide, or cumenehydroperoxide may be used.

Examples of the azobis compound include without limitation 1,1'-azobiscyclohexane-1-carbonitrile, 2,2'-azobis-(2,4-dimethylvaleronitrile), 2,2'-azobis-(4-methoxy-2,4-dimethylvaleronitrile), 2,2'-azobis-(methylisobutylate), 2,2'-azobis-(isobutyronitrile), 4,4'-azobis-(4-cyanovaleric acid), and the like, and combinations thereof.

Examples of the silane coupling agent may include without limitation vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof. The resin composition may include the silane-based coupling agent in an amount ranging from about 0.01 wt % to about 2 wt %, based on the total weight of the resin composition. When the silane-based coupling agent is included in an amount within this range, it may provide excellent adherence, storage stability, and coating properties.

According to another embodiment of the present invention, the photosensitive resin composition for a color filter may be prepared by mixing the aforementioned dye, pigment, acrylic-based binder resin, photopolymerizable monomer, photopolymerization initiator, and solvent, and optionally, one or more additive(s).

According to yet another embodiment of the present invention, a color filter is fabricated by using the photosensitive resin composition for a color filter.

The photosensitive resin composition for a color filter can be coated to a thickness of about 1.5 μm to about 3.0 μm on a suitable substrate such as a bare glass substrate or a glass substrate coated with 500 Å to 1500 Å-thick SiNx (a protective layer) using a method such as spin-coating, slit-coating, and the like. After coating, the layer is patterned for a color filter by exposing the layer to radiation (an active ray). The exposing step can be performed by using a light source, for example, a UV ray having a wavelength ranging from 190 nm to 450 nm, for example from 200 nm to 400 nm, an electron beam, or an X ray. The radiated coating layer is treated with an alkali development solution and is thus patterned, as the unradiated region is dissolved. This process can be repeated as many times as the number of necessary colors, to provide a color filter with a desired pattern. Furthermore, the acquired image, pattern may be heated again or cured by exposing to radiation (an active ray) to further improve crack-resistance, solvent-resistance, and the like.

Hereinafter, the embodiments are illustrated in more detail with reference to examples. However, the following embodiments are exemplary and are not limiting.

Preparation of Photosensitive Resin Composition for Color Filter

Example 1

(A) Dye
1.0 g of hydroxy[2-hydroxy-5-nitro-3-[[2oxo-1-[(phenylamino)carbonyl]propyl]azo]benzenesulfonate (3-)]-chromate (1-), and tri-n-octylammonium
(B) Pigment
5.0 g of a C.I. red pigment 254/177 (a weight ratio of 60/40)

(C) Acrylic-Based Binder Resin
5.0 g of methacrylic acid/benzylmethacrylate (a weight ratio of 30/70, a molecular weight=28,000)
(D) Photopolymerizable Monomer
5.0 g of dipentaerythritolhexaacrylate
(E) Photopolymerization Initiator
2.0 g of an oxime-based initiator (CGI-124)
(F) Solvent
66.5 g of propyleneglycolmonomethyletheracetate
15 g of cyclohexanone
(G) Other Additives
0.5 g of a fluorine-based surfactant (F-482, DIC Co., Ltd.)

The photopolymerization initiator is dissolved in the solvent, and the solution is agitated at a room temperature for 2 hours. The dye, acrylic-based binder resin, and photopolymerizable monomer are added to the agitated product. The mixture is agitated at a room temperature for 2 hours. Then, the pigment is added to the resulting product. The mixture is agitated at a room temperature for one hour, and the surfactant is added thereto. The resulting mixture is agitated at a room temperature for one hour. The composition is filtered three times to remove impurities, preparing a photosensitive resin composition for a color filter according to Example 1.

Example 2

A photosensitive resin composition for a color filter is prepared according to the same method as in Example 1 except for using 1.0 g of 3-[[4-(phenylaminophenyl]azo]-benzenesulfonate and tri-n-octylammonium instead of 1.0 g of hydroxy[2-hydroxy-5-nitro-3-[[2oxo-1-[(phenylamino)carbonyl]propyl]azo]benzenesulfonate (3-)]-chromate (1-), and tri-n-octylammonium as a dye (A) in Example 1, Example 3

A photosensitive resin composition for a color filter is prepared according to the same method as in Example 1 except for using 1.0 g of 4-[[4-[(4-hydroxy-2-methylphenyl) azolephenyl]amino]-3-nitro-benzenesulfonate and tri-n-octylammonium instead of 1.0 g of hydroxy[2-hydroxy-5-nitro-3-[[2oxo-1-[(phenylamino)carbonyl]propyl]azo] benzenesulfonate (3-)]-chromate (1-) and tri-n-octylammonium as a dye (A) in Example 1.

Example 4

A photosensitive resin composition for a color filter is prepared according to the same method as in Example 1 except for using 1.0 g of hydroxy[2-hydroxy-5-nitro-3-[[2oxo-1-[(phenylamino)carbonyl]propyl]azo]benzenesulfonate (3-)]-chromate (1-) and tri-n-dodecylammonium instead of 1.0 g of hydroxy[2-hydroxy-5-nitro-3-[[2oxo-1-[(phenylamino)carbonyl]propyl]azo]benzenesulfonate (3-)]-chromate (1-) and tri-n-octylammonium as a dye (A) in Example 1.

Comparative Example 1

A photosensitive resin composition for a color filter is prepared according to the same method as in Example 1 except for using 1.0 g of a C.I. yellow pigment 150 instead of the dye (A) in Example 1.

Comparative Example 2

A photosensitive resin composition for a color filter is prepared according to the same method as in Example 1 except for using 1.0 g of a C.I. yellow pigment 138 instead of the dye (A) in Example 1.

Comparative Example 3

A photosensitive resin composition for a color filter is prepared according to the same method as in Example 1 except for using 1.0 g of a red dye (VR-3311, Orient Chemical Co., Ltd.) instead of the dye (A) in Example 1 but without using the pigment (B).

Property Evaluation 1: Luminance Measurement

The photosensitive resin compositions for a color filter according to Examples 1 to 4 and Comparative Examples 1 to 3 are each coated to a thickness of 1 μm to 2 μm on a 1 mm-thick oil-free and washed glass substrate. The coated substrate is dried on a 90° C. hot-plate for 3 minutes. The resulting product is cooled and exposed to a light with an exposure amount of 100 mJ/cm² (referring to 365 nm), and dried in a 230° C. hot-air convective dryer for 30 minutes. Then, the luminance of the resultant layer is measured using a spectrophotometer (MCPD3000, Otsuka Electronics Co., Ltd.). The results are provided in the following Table 1.

The luminance is measured with a reference to an Rx value of 0.651. The contrast ratio is measured with a reference to 20,000:1 (bare glass).

Luminance Evaluation Reference

◉: Ry of more than 19
○: Ry ranging from 18.5 to 19
Δ: Ry ranging from 18 to 18.5
x: Ry of less than 18

Property Evaluation 2: Contrast Ratio Measurement

The photosensitive resin compositions for a color filter according to Examples 1 to 4 and Comparative Examples 1 to 3 are each coated to a thickness of 2 μm on an oil-free and washed 1 mm-thick and 10 cm×10 cm-sized glass substrate (bare glass) using a spin-coater (K-Spin8, KDNS Co., Ltd.) and then soft-baked on a 90° C. hot plate for 90 seconds and cooled to room temperature for one minute. Then, a contrast tester CT-1 made by Tsubosaka Electric Co., Ltd. is used to measure a light amount when a polarizer is open and closed. A contrast ratio is calculated according to the following Equation 1. The contrast ratio results are provided in the following Table 1.

$$\text{Contrast ratio} = L_{open}/L_{close} \quad \text{[Equation 1]}$$

$L_{open}$: light amount when a polarizer is open
$L_{close}$: light amount when a polarizer is closed Contrast Ratio Evaluation Reference ◉: contrast ratio of more than 13,000
○: contrast ratio ranging from 12,500 to 13,000
Δ: contrast ratio ranging from 12,000 to 12,500
x: contrast ratio of less than 12,000

Property Evaluation 3: Coating Properties Evaluation

The photosensitive resin compositions for a color filter according to Examples 1 to 4 and Comparative Examples 1 to 3 are each coated to a thickness of 1 μm to 2 μm on an oil-free and washed 1 mm-thick glass substrate and then dried with a reduced pressure drier. After drying the coated substrate for 2 minutes, its stain is enlarged 100 times and examined with an optical microscope. The results are provided in the following Table 1.

Coating Properties Evaluation Reference

◉: small stain degree and less than 20 stains
○: small stain degree and less than 50 stains
Δ: large stain degree and less than 50 stains
x: more than 50 stains regardless of a stain degree Property Evaluation 4: Heat Resistance Measurement The photosensitive resin compositions for a color filter according to Examples 1 to 4 and Comparative Examples 1 to 3 are each coated to a thickness of 1 μm to 2 μm on an oil-free and washed 1 mm-thick glass substrate and then dried on a 90° C. hot-plate for 3 minutes The resulting product is cooled and exposed to a light with an exposure amount of 100 mJ/cm² (with a reference to 365 nm) and stored in a 230° C. hot air convective drier for 1 to 3 hours. Then, the color change is measured using a spectrophotometer (MCPD3000, Otsuka Electronics Co., Ltd.). The results are provided in the following Table 1.

Heat Resistance Evaluation Reference

◉: no color change or color difference (ΔE) of less than 1.0 after 3 hour treatment
○: 1.0<color difference (ΔE)<3.0 after 3 hour treatment
Δ: color difference (ΔE)>3.0 after 3 hour treatment or color difference (ΔE)<3.0 after 1 hour treatment
x: a color difference recognized with bare eyes but color difference (ΔE)>3.0 after one hour treatment

TABLE 1

|  | Luminance | Contrast ratio | Coating properties | Heat resistance |
|---|---|---|---|---|
| Example1 | ◉ | ◉ | ◉ | ◉ |
| Example2 | ◉ | ◉ | ○ | ○ |
| Example3 | ◉ | ◉ | ○ | ○ |
| Example4 | ◉ | ◉ | ◉ | ◉ |
| Comparative Example1 | Δ | Δ | Δ | ○ |
| Comparative Example2 | Δ | X | Δ | ○ |
| Comparative Example3 | X | Δ | X | X |

Referring to Table 1, the photosensitive resin compositions for a color filter of Examples 1 to 4 exhibit excellent luminance and contrast ratios at the same color coordinate as compared with the photosensitive resin composition for a color filter according to Comparative Examples 1 and 2. In addition, the photosensitive resin compositions for a color a filter of Example 1 to 4 have excellent coating properties and heat resistance under the reduced pressure drying. Based on the results, the luminance is improved due to high transmittance within the ultraviolet (UV) region of a dye ranging from 480 nm to 800 nm. The dye is soluble in an organic solvent, unlike a dispersion of pigment particles, and thus, the dye has a very small primary particle diameter or no particles in the photosensitive resin composition for a color filter. As a result, the dye can decrease unnecessary light scattering and improve contrast ratio.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising:
    (A) an organic salt sulfonate-containing dye;
    (B) a pigment;
    (C) an acrylic-based binder resin;
    (D) a photopolymerizable monomer;
    (E) a photopolymerization initiator; and
    (F) a solvent,
    wherein the dye and the pigment are not the same and are included at a weight ratio of about 1:99 to about 1:99 wherein the dye is represented by the following Chemical Formula 1:

[Chemical Formula 1]

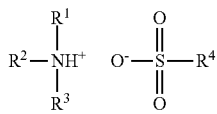

wherein, in Chemical Formula I,
$R^1$ to $R^3$ are each independently hydrogen, substituted or unsubstituted C1 to C20 alkyl, substituted or unsubstituted C3 to C20 cycloalkyl, or a combination thereof, with the proviso that all of $R^1$ to $R^3$ are not hydrogen, and
$R^4$ is substituted or unsubstituted C1 to C20 heteroalkyl, substituted or unsubstituted C3 to C20 heterocycloalkyl, substituted or unsubstituted C3 to C20 heteroaryl, or a combination thereof, and includes an imine group, an azo group, a pyrazolone group, a fuchsine group, an anthraquinone group, or a combination thereof.

2. The photosensitive resin composition for a color filter of claim 1, wherein the dye represented by Chemical Formula 1 comprises ammonium ion comprising a trioctylammonium ion, a tridodecylammonium ion, a dioctylammonium ion, or a combination thereof.

3. The photosensitive resin composition for a color filter of claim 1, wherein the dye represented by Chemical Formula 1 comprises a sulfonate comprising:
    2,5-dichloro-4-4,5-dihydro-3-methyl-5-oxo-4-(4-sulfophenyl)azo]1H-pyrazol-1-yl-benzenesulfonate,
    4-chloro-3-[4,5-dihydro-3-methyl-5-oxo-4-[[3-[(phenylamino)sulfonyl]phenyl]azo]-1H-pyrazol-1-yl]-benzenesulfonate,
    3-[[4-(phenylamino)phenyl]azo]-benzenesulfonate,
    [1,1'-biphenyl]-2,2'-disulfonate,
    4,4'-bis[(4,5-dihydro-3-methyl-5-oxo-1-phenyl-1H-pyrazol-4-yl)azo]-benzenesulfonate,
    hydroxy[2-hydroxy-5-nitro-3-[[2-oxo-1-[(phenylamino)carbonyl]propyl]azo]benzenesulfonate (3-)]-chromate (1-),
    4-[[4-[(4-hydroxy-2-methylphenyl)azolphenyl]amino]-3-nitro-benzenesulfonate,
    2-amino-5-[(4-amino-3-sulfophenyl)(4-imino-3-sulfo-2,5-cyclohexadien-1-ylidene)methyl]-3-methyl-benzenesulfonate,
    N-[4-[[4-(dimethylamino)phenyl][ethyl[(3-sulfophenyl)methyl]amino]phenyl]methylene]-2,5-cyclohexadien-1-ylidene]-N-ethyl-3-sulfo-benzenemethanaminium, or a combination thereof.

4. The photosensitive resin composition for a color filter of claim 1, wherein the pigment comprises a dipyrrolopyrrole-based red pigment, a halogen-substituted copper phthalocyanine-based green pigment, a halogen-substituted zinc phthalocyanine-based green pigment, a copper phthalocyanine-based blue pigment, an isoindoline-based yellow pigment, a quinophthalone-based yellow pigment, a nickel complex-based yellow pigment, or a combination thereof.

5. The photosensitive resin composition for a color filter of claim 4, wherein the pigment comprises a C.I. red pigment 254, a C.I. red pigment 255, a C.I. red pigment 264, a C.I. red pigment 270, a C.I. red pigment 272, a C.I. red pigment 177, a C.I. red pigment 89, a C.I. green pigment 36, a C.I. green pigment 7, a C.I. green pigment 58, a C.I. blue pigment 15:6, a C.I. blue pigment 15, a C.I. blue pigment 15:1, a C.I. blue pigment 15:2, a C.I. blue pigment 15:3, a C.I. blue pigment 15:4, a C.I. blue pigment 15:5, a C.I. blue pigment 16, a C.I. yellow pigment 139, a C.I. yellow pigment 138, a C.I. yellow pigment 150, or a combination thereof.

6. The photosensitive resin composition of claim 1, wherein the photosensitive resin composition for a color filter comprises
    about 0.1 wt % to about 20 wt % of the dye (A);
    about 0.1 wt % to about 30 wt % of the pigment (B);
    about 0.5 wt % to about 15 wt % of the acrylic-based binder resin (C);
    about 0.5 wt % to about 15 wt % of the photopolymerizable monomer (D);
    about 0.01 wt % to about 5 wt % of the photopolymerization initiator (E); and
    a balance amount of the solvent (F).

7. A color filter manufactured using the photosensitive resin composition for a color filter according to claim 1.

8. The photosensitive resin composition of claim 1, wherein the dye and the pigment are included at a weight ratio of about 5:95 to about 30:70.

* * * * *